United States Patent [19]

Mahieu et al.

[11] 4,072,901
[45] Feb. 7, 1978

[54] MICROWAVE CRYSTAL HOLDER

[75] Inventors: Jean-René Mahieu; Michel Robin, both of Paris, France

[73] Assignee: Societe Lignes Telegraphiques et Telephoniques, Paris, France

[21] Appl. No.: 705,030

[22] Filed: July 14, 1976

[30] Foreign Application Priority Data

July 18, 1975 France ................................ 75 22594

[51] Int. Cl.² .......................... H04B 1/26; H01P 1/00
[52] U.S. Cl. .................................... 325/445; 329/161; 333/98 R
[58] Field of Search ............... 333/35, 98 R; 329/161; 321/69 N, 69 L; 325/445, 449

[56] References Cited

U.S. PATENT DOCUMENTS

| 2,871,353 | 1/1959 | Friis et al. | 329/161 X |
| 3,231,838 | 1/1966 | Sharpless | 329/161 X |
| 3,541,460 | 11/1970 | Socci | 329/161 |
| 3,939,446 | 2/1976 | Kozul et al. | 333/98 R |

Primary Examiner—Paul L. Gensler
Attorney, Agent, or Firm—Kemon & Estabrook

[57] ABSTRACT

A wafer type millimetric crystal holder of the Sharpless type with an impedance matched i.f. coaxial output. The connection between the i.f. coaxial output and the diode comprises two coaxial quarter wavelength stubs interconnected by a strip line element with a wire central conductor operating as a rejector at the carrier frequency. The diameter of the central conductor is determined by the impedance matching condition.

3 Claims, 5 Drawing Figures

SMITH CHART

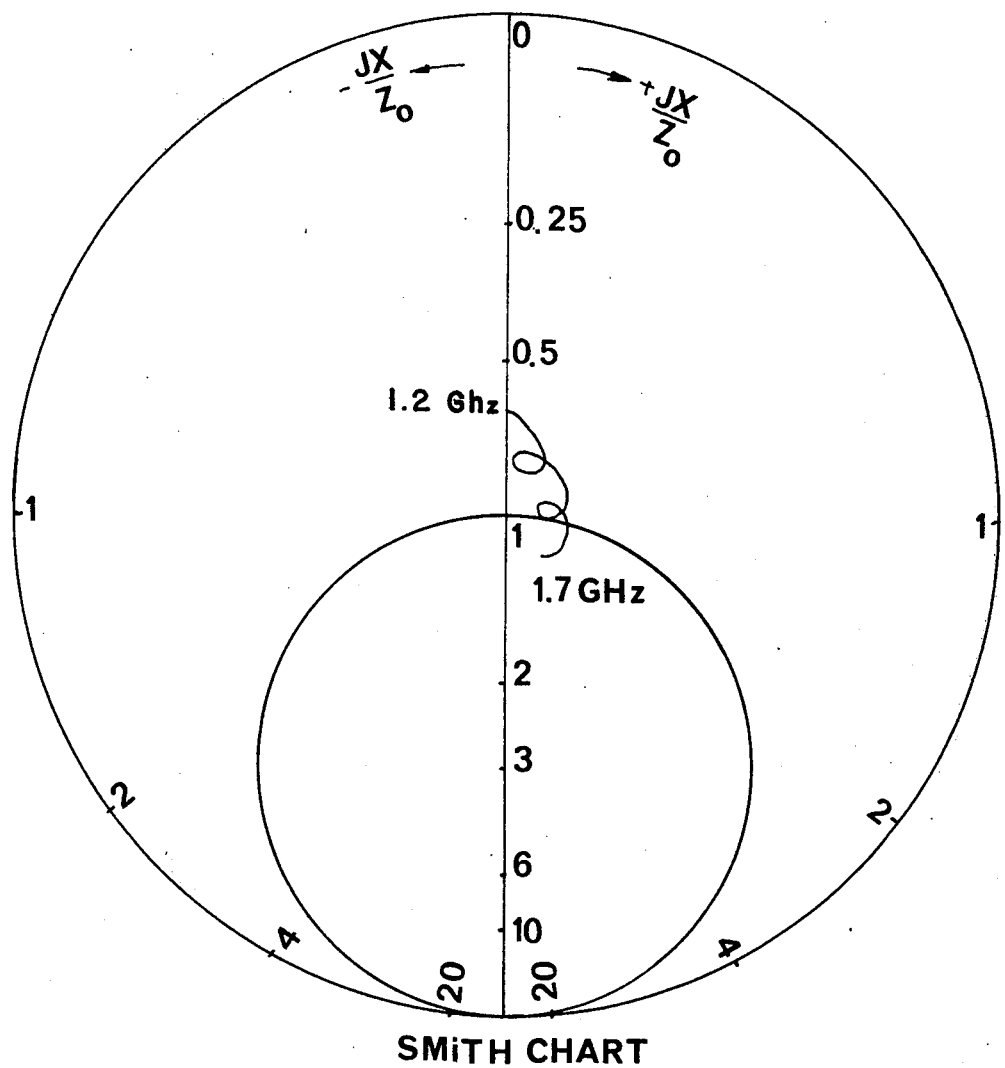

MICROWAVE CRYSTAL HOLDER

BACKGROUND OF THE INVENTION AND PRIOR ART

The invention relates to an improved crystal holder for mixer diode such as Schottky diode of the wafer type operating in the millimeter band. Semiconductive diodes are used in mixer or frequency converters in communication systems operating in the millimetric range. Waveguide is the usual transmission line used at such frequencies. The crystal holder is to be designed so as to fit in the waveguide. A type of crystal holder for waveguide circuits has been described by Sharpless in Bell System Technical Journal Volume 25, page 1385 (1956) in the article entitled "Wafer type millimetric wave rectifiers."

In the Transactions of IEEE on Microwave Theory and Techniques, Volume 16, No. 5, issued in May 1968, a crystal holder of the Sharpless type is described to be used in a circuit operating at a carrier frequency of 51.7 GHz and an intermediate frequency of 1.3 GHz. FIG. 1 taken from the above article shows the crystal holder made of a metal wafer 1 machined with a rectangular hole 2 the smallest dimension of which is equal to the smallest dimension of waveguide type RG 97/U while the largest dimension is larger than the corresponding waveguide dimension. The wafer is also machined with a circular aperture 3 and a recess 4 for the central conductor 5 of a standard coaxial plug which constitutes the intermediate frequency output. Conductor 5 is connected to a wire 6 which is bent at 90° in order to penetrate in the holes 7 and 8 machined in the thickness of plate 1. Wire 6 is set in holes 7 and 8 by means of dielectric sheaths. The end of wire 6 terminates at the level of the inner wall of hole 2 and contacts the Schottky chip which is not visible in FIG. 1.

It is known that a high modulation yield requires that the local frequency of carrier frequency wave should not be transmitted in the intermediate frequency amplifier as explained in the Bell System Technical Journal, article published page 1291 of the September 1968 issue.

The main object of the present invention is a crystal holder which provides rejection of the carrier or local frequency and impedance matching at the intermediate frequency that is, the impedance at plug 5 is 50 ohms or any other standardized value. The crystal holder according to the invention provides the following advantages. Impedance matching at intermediate frequency increases the conversion yield with respect to prior art by at most one decibel. The diode seen from the input of the crystal holder has an impedance equal to 50 ohms. It is therefore possible to interchange any crystal holder without any further adjustment of the intermediate frequency circuit. Individual matching of crystal holder with respect to individual diode is performed in the factory through control of the interconnecting wire length and diameter. Experience shows that for a given batch of diodes the same mechanical setting can be used.

SUMMARY OF THE DISCLOSURE

The connection between the mixer diode chip and the coaxial output at intermediate frequency is achieved by means of two coaxial stubs located on both side of an interconnecting wire; the coaxial stubs are a quarter wavelength long at the carrier frequency and the interconnecting wire is made of the thin wire with a length equal to an odd multiple of a quarter wavelength in the air at the carrier frequency connected at both end to the central conductor of the coaxial stubs. The diameter of said interconnecting wire and the characteristic impedance of the coaxial stubs are selected so that the impedance of the diode as seen at the intermediate frequency output be equal to the standard impedance of 50 ohms at said frequency.

DETAILED DESCRIPTION OF THE INVENTION

The invention will be understood by reference to the following detailed description and reference to the FIGS. 1 to 5 given as a non limitative illustration of an embodiment of the invention and in which:

FIG. 5 shows the Smith diagram of the crystal holder according to the invention incorporating the above diode.

Figure 1:
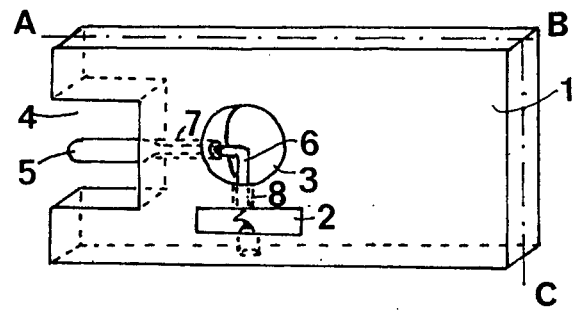
FIG. 1 shows a prior art crystal holder.

FIG. 1 has already been described above.

Figure 2:
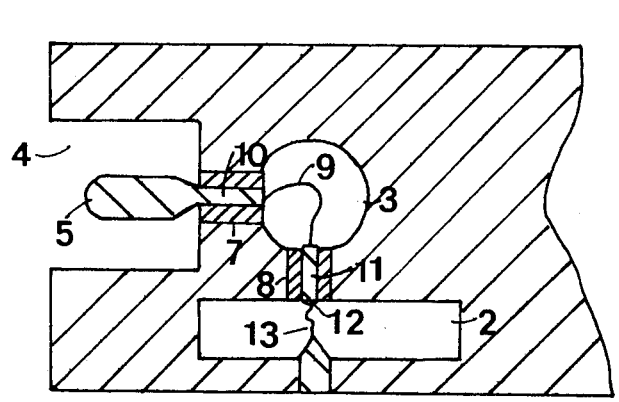
FIG. 2 shows a crystal holder according to the invention.

FIG. 2 shows a cut view of the crystal holder according to the invention along a plane cutting FIG. 1 along the line A, B, C. The same parts bear the same reference in both figures.

The length of bores 7 and 8 is equal to a quarter wavelength within the dielectric sheathing material which surrounds conductors 10 and 11 at the carrier frequency. These conductors are of the same type as conductor 6 in FIG. 1. The length of the interconnecting wire 9 between conductors 10 and 11 is equal to three quarter of the wavelength in the air at the carrier frequency. Holes 2, 3 and 4 have the same dimensions as the corresponding elements of the FIG. 1. The diode consists in chip 12, set in the large wall of hole 2 in contact with the end of conductor 11. Wisker 13 constitutes the other electrode of diode.

Figure 3:
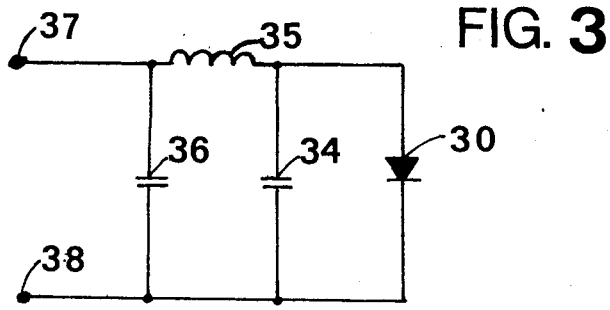
FIG. 3 is the equivalent circuit of the crystal holder at intermediate frequency.
Figure 4:
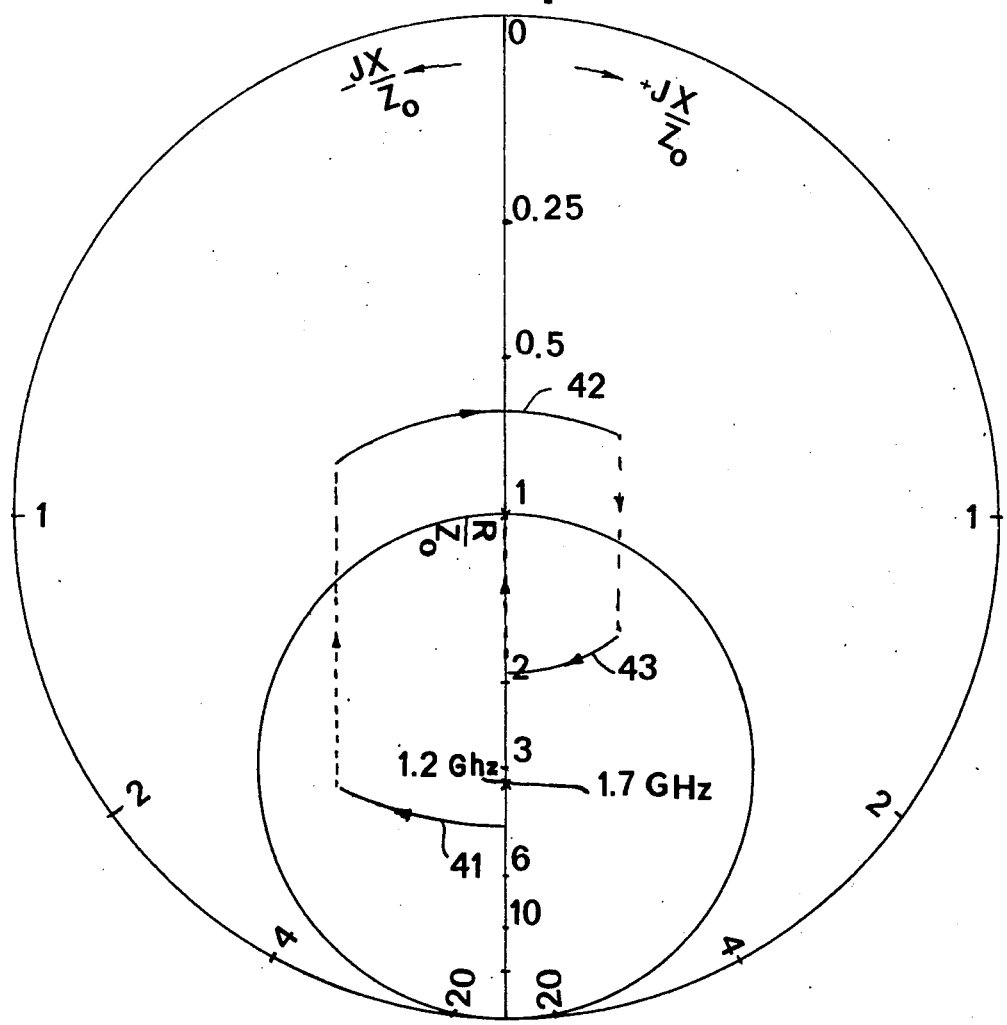
FIG. 4 shows the Smith diagram of a millimetric Schottky diode at the intermediate frequency.

FIG. 3 is the equivalent circuit of the crystal holder unit at the intermediate frequency. The diode is shown at 30 connected to a low pass filter cell constituted by capacitors 34 and 36 and inductor 35. Capacitor 34 corresponds to the coaxial stub 8 - 11 connected in parallel with diode 12 - 13. Inductor 35 corresponds to the inductance of wire 9 and capacitor 36 corresponds to the coaxial stub 7 - 10. The two plugs 37 and 38 represent the input of the crystal holder at the intermediate frequency in the output plane of the coaxial 7 - 10. At the carrier frequency coaxial stub 8 - 11 is loaded at its upper end by the high impedance constituted by hole 3 and will act as a short circuit in the plane of the wall of hole 2 which bears the diode chip. Capacitors 34 and 36 and inductor 35 constitute a low pass filter with a cut-off frequency selected between the intermediate frequency and the carrier frequency. FIG. 4 shows a measured impedance diagram of a diode at the intermediate frequency when the crystal holder is set in a waveguide. The position of the diode in the waveguide, the length of the wisker and the dimension of the chip are set according to current practice so that the diode impedance is matched with the waveguide impedance at the carrier frequency. In order to match the diode impedance to the coaxial plug impedance at intermediate frequency an impedance measurement is carried on between outputs 37 and 38 or which is equivalent in the plane at the end of the coaxial stub 7 - 10 where it should be connected to a standard coaxial line. It is then possible to calculate the impedance of the diode at intermediate frequency since the characteristic impedance of both coaxial stubs and the diameter of the wire 9 are known. Measurement carried on at different carrier frequencies and at the same intermediate frequency show that the results are almost constant and FIG. 4 is typical of a given Schottky diode.

Assuming that the diode impedance has the measured value at the selected intermediate frequency, the circuit elements of the interconnecting line between the diode and the output coaxial plug are calculated as follows with reference to the equivalent circuit of FIG. 3.

To each of the stubs (capacitors 34 and 36) correspond two parameters, that is its characteristic impedance and its electrical length. The electrical lengths are set by the following conditions: both stubs should be quarter wavelength at the carrier frequency and conductor 9 should be electrically equivalent to a quarter wavelength or an odd multiple of a quarter wavelength. In the following example, the stubs are quarter wavelength long and the wire 9 is three quarter wavelength long. The wire diameter is to be selected among available wire diameters as supplied by metallurgical industry. Therefore, the characteristic impedance of the wire 9 can only take a number of fixed preset values. This element is equivalent to a strip line as explained below. The characteristic impedances $z_{34}$ and $z_{36}$ of stubs 34 and 36 respectively depend on the respective diameters of the central conductor, the external conductor and the dielectric constant of the intermediate medium or sheath. The electric length of each element is represented by $p$ sub the number of the corresponding element and the characteristic impedance is noted Z sub the number of the corresponding element, $c$ is the speed of light, $Z_D$ is the diode impedance.

$$z_{34} = \frac{1}{Z_{34}} \frac{p_{34}}{c}$$

$$z_{36} = \frac{1}{Z_{36}} \frac{p_{36}}{c}$$

$$z_{35} = j\omega L_{35}$$

$$Z_D = a + jb$$

The output impedance $Z_o$ (between 37 and 38) of the network of FIG. 3 is:

$$\frac{1}{Z_o} = \frac{1}{z_{36}} + \frac{1}{\frac{Z_D \cdot z_{34}}{Z_D + z_{34}} + j\omega L_{35}}$$

(1) must be equal to 1/50 (matching condition) further $l_{34}$ and $l_{36}$ are set by the electrical length at carrier frequency. Free parameters are $Z_{34}$, $Z_{36}$ and $L_{35}$. Let us calculate $L_{35}$ $$L_{35} = -\frac{j}{\omega}\left[\frac{Z_o \cdot z_{36}}{z_{36} - Z_o} - \frac{Z_D \cdot z_{34}}{Z_D + z_{34}}\right] \quad (2)$$

when replacing $Z_D$ by its value $$L_{35} = -\frac{j}{\omega}\left[\frac{Z_o + jZ_o^2 z_{36} \cdot \omega}{1 + Z_o^2 z_{36}^2 \omega^2} - \frac{a - j[(a^2 + b^2)z_{34}\omega - b]}{a^2 z_{34}^2 \omega^2 + (1 - bz_{34}\omega)^2}\right] \quad (3)$$

L should be real which corresponds to:

$$\frac{Z_o}{1 + Z_o^2 z_{36}^2 \omega^2} - \frac{a}{a^2 z_{34}^2 \omega^2 + (1 - bz_{34}\omega)^2} = 0 \quad (4)$$

(3) shows that there is a relationship between $Z_{36}$ and $Z_{34}$ to be met which eliminates one of the three parameters left. If $b = 0$ (impedance of the diode real) (4) simplifies to $$\frac{Z_o}{1 + Z_o^2 z_{36}^2 \omega^2} - \frac{a}{a^2 z_{34}^2 \omega^2 + 1} = 0 \quad (4')$$

in this case the value of $L_{35}$ is given by (3) becomes:

$$L_{35} = \frac{Z_o^2 z_{36}}{Z_o^2 z_{36}^2 \omega^2 + 1} + \frac{a^2 z_{34}}{a^2 z_{34}^2 \omega^2 + 1} \quad (5)$$

Equation (5) gives the value of the inductance. It is related to the wire diameter as is explained below.

When the impedance value of the inductance is given by equation (5), it is necessary to transform this data into the length and wire diameter for wire 9. As already referred, the wire 9 between the ends of the coaxial stubs is equivalent to an air insulated strip with wire 9 as the central conductor and the walls of the crystal holder wafer as external plate conductors. "Microwave Engineers' Handbook," Vol. 1, pages 118 and 119, provide respectively means to relate the inductance value of a strip line section and the correction to be made when the central conductor is round (such as wire 9) with the geometrical data. These allow one to select the wire diameter, the length being set by the condition that it should be an odd multiple of the quarter wavelength at the carrier frequency for carrier rejection.

Due to metallurgical considerations, the wire diameter value is not a completely free parameter, a choice may only be made between commercially available wire diameters.

The whole calculation process may be programmed in a computer which stores the available diameter values and is able through trial and error operaton to fix the optimum wire diameter among the commercially available values.

FIG. 4 shows the Smith diagram of rationalized impedances (impedance ratio to characteristic impedance) and shows how to fix $Z_{36}$ (or $Z_{34}$) when $Z_{34}$ (or $Z_{36}$) is known from equation (4). The diode impedance is given by the diode supplier (or through a local measurement) let us say that it is $Z = a + jb$ according to the above writing. From the known values of $a$ and $b$, it can be seen that $b$ is very small for millimetric mixer diodes and can be plotted as equal to zero. The limit conditions are as follows:

1. set an impedance $Z = 50$ ohms $+ j0$ at the intermediate frequency at the coaxial output 5.
2. to provide for the electrical continuity of the waveguide wall at the location of the semiconductor chip at the carrier frequency.

3. to isolate the i.f. output from the microwave propagating in the waveguide.

The starting point shown as X represents the known measure of the diode impedance at the intermediate frequency. It can be seen that the imaginary part of this impedance is equal to zero, a simplification which can be made due to the very small junction capacity value of the Schottky millimetric diodes when operating in the neighbourhood of 1.5 GHz. Curve 41 shows the influence of capacitor 34 (with rationalized impedance : change of characteristic impedance corresponds to the dashed lines on the diagram) and leads to the impedance at the lower end of conductor 9; curve 42 is the impedance change due to the line element consisting of wire 9 associated with the metal planes; curve 43 is the impedance modification due to capacitor 36. The end of curve 43 should necessarily correspond to Z = 50 ohms + j0 (point unity on the real axis in the diagram).

Using this method, as an example, a crystal holder was designed for operating at carrier frequency of 44 GHz and intermediate frequency of 1.450 GHz. Both coaxial stubs 7 - 10 and 8 - 11 are 0.9 millimeter long which corresponds to a quarter wavelength in a coaxial with an epoxy dielectric and a central conductor diameter of 0.9 millimeter. Conductor 9 is a gold wire with a 12 micrometer diameter and a length of 5 millimeter corresponding to three quarters of wavelength in air. The capacity 34 of the first coaxial stub is 1.38 pF, the capacity 36 of the second stub is 0.45 pF, inductance of 35 is 5.500 nH. The diode impedance as measured is 170 ohms.

The line in FIG. 5 which passes through the initial point necessary representing the diode impedance relates to diode impedances measured at other intermedaite frequency up to 1.7 GHz. It can be seen that the crystal holder matching covers a relatively wide intermediate frequency bandwidth. Measurements carried on such a crystal holder show that the carrier frequency at the output of stub 7 - 10 is about 20 dB lower than the carrier frequency level at the chip location. Such a crystal holders gives a 6 dB conversion loss with a given millimetric diode and doen to 5 dB conversion loss with other types of diodes. The noise factor has a typical value of 8 dB measured at 1.45 GHz in a single side band operation with a meter preamplifier noise of 2.7 dB at the same frequency.

Large scale production of the holder rests on the assumption that the impedance of the available microwave mixer diodes has a fixed value independent of the particular diode to be mounted in a particular holder. This assumption is fully verified by experience. As is well known from semiconductor art, chips are large scale or at least medium scale batch produced (several thousands) on a semi-conductor wafer which is scribed into unitary chips after completion of the manufacturing process. The above assumption relies on the following results. Statistical static measurements have been carried on on wafers divided into about 20 parts and in each part one randomly distributed diode is measured for series resistance and junction capacity. It has been verified, as is well known, that in order to obtain satisfactory microwave operation the static values of the diode should lie within prescribed value ranges. Experience shows that over 80% of the chips meet this requirement, and when mounted in a wafer type crystal mount according to the invention about the same percentage have the same microwave impedance, that is for a particular production a real resistance of 170 ohms and a negligible reactance.

What we claim:

1. A wafer crystal holder for frequency converters operating at millimeter wavelength, comprising a high conductivity metallic body having a square slot in an end face thereof, and a rectangular aperture in a side face thereof through which a modulated carrier frequency and a local frequency are propagated, a cylindrical aperture on said side face, two coaxial stubs, one quarter wavelength at carrier frequency, the first one located between said rectangular aperture and said cylindrical aperture, the second one between said cylindrical aperture and said square slot, an output standard coaxial connection for intermediate frequency positioned within said slot, a wafer crystal located in said rectangular aperture in contact with one end of the first of said stubs, and means connecting the ends of said stubs in said cylindrical aperture by a wire the length of which is an odd number of quarter wavelengths at said carrier frequency and the diameter of which is selected so that the output impedance at the intermediate frequency is matched to the characteristic impedance of said standard coaxial output connection.

2. A wafer crystal holder according to claim 1, in which the characteristic impedances of the two coaxial stubs meet the following condition:

$$\frac{Z_o}{1 + Z^2 z^2_{36} W^2} - \frac{a}{a^2 z^2_{34} W^2 + (1 - bz_{34}W)^2} = 0$$

where $Z_o$ is the standard characteristic coaxial line impedance at intermediate frequency, $z_{36}$ and $z_{34}$ are the impedances of the stubs $a + jb$ is the mixer diode impedance $W = 2\pi$ fi where fi is the intermediate frequency.

3. A wafer crystal holder according to claim 2 where $b = 0$ and the diameter of said wire meets the condition:

$$L_{35} = \frac{Z^2 z^2_{36}}{Z^2 z^2_{36} W^2 + 1} + \frac{a^2 z_{34}}{a^2 z^2_{34} W^2 + 1}$$

where $L_{35}$ is the inductance of the wire conductor calculated between two end plates terminating the said cylindrical aperture $Z_o$ is the standard coaxial line impedance $z_{36}$ is the impedance of the coaxial stub located between the i.f. output plug and said cylindrical aperture $z_{34}$ is the impedance of the coaxial stub located between the diode chip and said cylindrical aperture $W = 2\pi$ fi where fi is the intermediate frequency.

* * * * *